(12) United States Patent
Gottswinter et al.

(10) Patent No.: US 6,614,661 B2
(45) Date of Patent: Sep. 2, 2003

(54) COVERING DEVICE FOR CERAMIC MODULES

(75) Inventors: Christian Gottswinter, Schierling (DE); Bernd Stadler, Donaustauf (DE); Oskar Neuhoff, Nittendorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/899,690

(22) Filed: Jul. 5, 2001

(65) Prior Publication Data

US 2002/0051344 A1 May 2, 2002

(30) Foreign Application Priority Data

Jul. 4, 2000 (DE) .......................................... 100 32 369

(51) Int. Cl.[7] ................................................. H05K 1/14
(52) U.S. Cl. ..................... 361/742; 361/800; 361/803; 361/818; 361/816; 361/748; 361/796
(58) Field of Search .................................. 361/800, 818, 361/816, 752, 753, 801, 759, 807, 804, 810, 742, 803, 728, 748, 730, 732, 796

(56) References Cited

U.S. PATENT DOCUMENTS

| | | | | |
|---|---|---|---|---|
| 5,436,802 A | * | 7/1995 | Trahan et al. ................ | 361/816 |
| 5,508,889 A | * | 4/1996 | Ii ................................. | 361/816 |
| 5,644,477 A | * | 7/1997 | Klein .......................... | 361/829 |
| 5,717,577 A | * | 2/1998 | Mendolia et al. ........... | 361/818 |
| 6,028,771 A | * | 2/2000 | Wong et al. ................. | 361/704 |
| 6,160,461 A | * | 12/2000 | Azuma et al. ............... | 333/172 |
| 6,181,568 B1 | * | 1/2001 | McHugh et al. ............ | 361/760 |
| 6,441,485 B1 | * | 8/2002 | Glenn ......................... | 257/727 |

FOREIGN PATENT DOCUMENTS

| | | |
|---|---|---|
| DE | 41 06 077 C2 | 9/1992 |
| DE | 198 03 358 C2 | 8/1999 |

* cited by examiner

Primary Examiner—David Martin
Assistant Examiner—Thanh Yen Tran
(74) Attorney, Agent, or Firm—Laurence A. Greenberg; Werner H. Stemer; Ralph E. Locher

(57) ABSTRACT

The covering device covers a ceramic module with electronic components arranged between a ceramic substrate and an upper covering plate of the covering device. The covering device is spaced apart by spacers from the surface of the ceramic substrate fitted with components. The covering device is fixed on the ceramic module by snap-in elements which engage in lateral cutouts in the ceramic substrate.

21 Claims, 4 Drawing Sheets

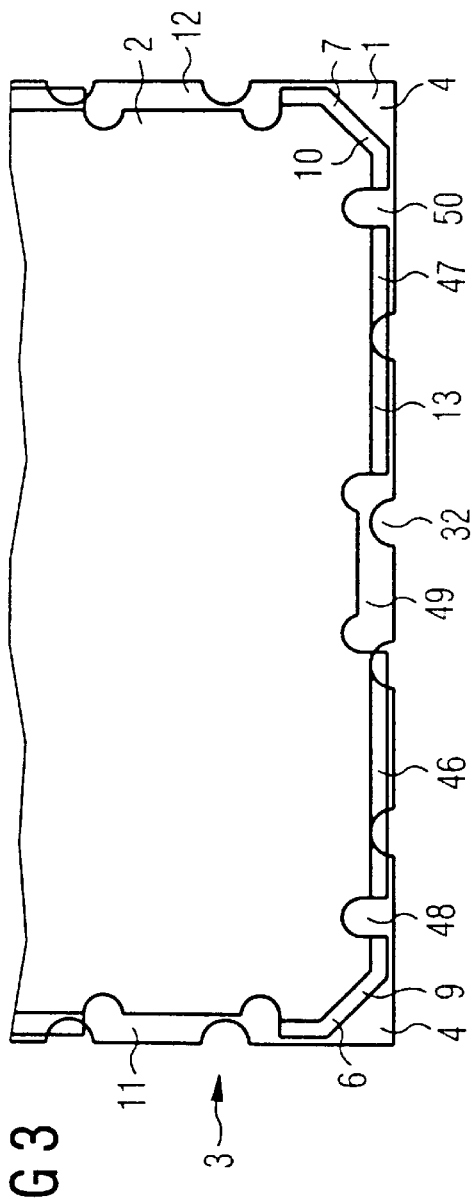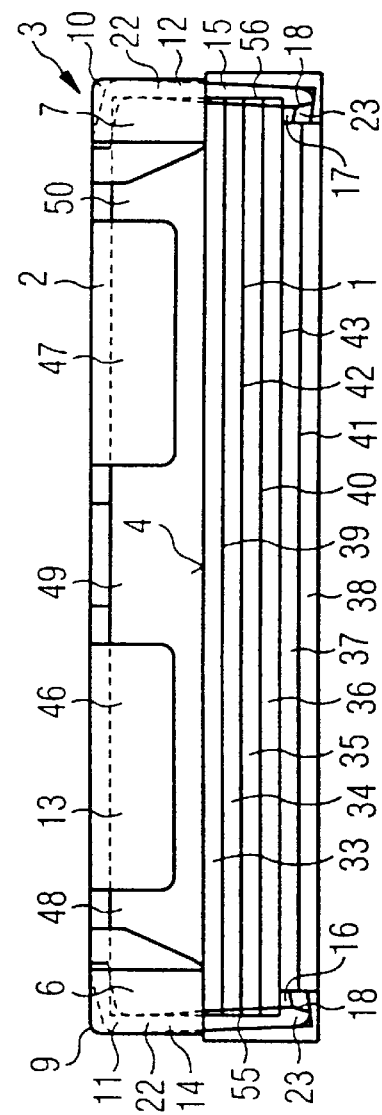

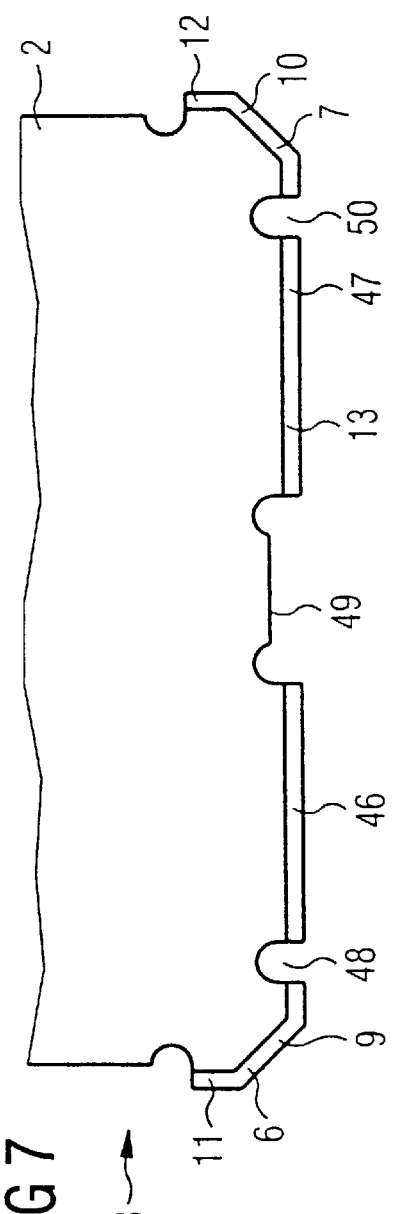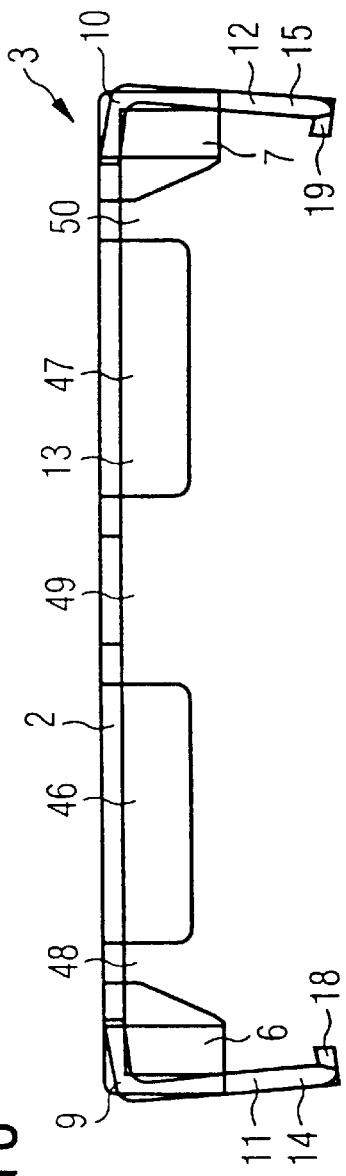

COVERING DEVICE FOR CERAMIC MODULES

BACKGROUND OF THE INVENTION

FIELD OF THE INVENTION

The present invention relates to a covering device for ceramic modules having electronic components which are arranged between a ceramic substrate and an upper covering plate of the covering device.

A covering device of this type is needed for high-frequency ceramic modules, in order to shield the components on the surface of the ceramic substrate, fitted with components, and to protect them against mechanical damage. When the covering devices are put onto the ceramic substrates, subsequent mechanical deformations of the covering device are necessary in order to fix the covering devices to the ceramic module with a form fit. In the process, the ceramic substrates can be damaged. In particular in the case of highly complex multilayer HF ceramic modules, damage of this type entails high losses.

SUMMARY OF THE INVENTION

The object of the present invention is to provide a shielding device which overcomes the above-noted deficiencies and disadvantages of the prior art devices and methods of this general kind, and which can be fixed to the ceramic module without subsequent mechanical deformation.

With the above and other objects in view there is provided, in accordance with the invention, a covering device for a ceramic module of the type having electronic components arranged on a surface of a ceramic substrate, the covering device comprising:

an upper covering plate to be disposed above the electronic components on the surface of the ceramic substrate;

spacers supporting the covering device on the surface of the ceramic substrate fitted with the electronic components;

snap-in elements on at least two opposite side edge areas of the covering device, said snap-in elements engaging with at least one of a frictional fit and a form fit in lateral cutouts formed in the ceramic substrate and corresponding to said snap-in elements.

In other words, the covering device is supported on the surface of the ceramic substrate, fitted with components, via spacers, and the covering device has, on at least two opposite side edge areas, snap-in elements which engage with a frictional and form fit in lateral cutouts in the ceramic substrate corresponding to the snap-in elements.

The subject of the invention has the advantage that, with the snap-in elements, the different dimensions of the ceramic substrates, which are subject to high production fluctuations, can be compensated for, since the covering device adapts to the outlines of the ceramic substrate within wide limits during assembly. It is therefore not necessary for specific tolerance classes for the covering device to be kept in store, instead one covering device can be used for a wide range of tolerance classes of ceramic modules.

When the covering device is put onto a ceramic module, the snap-in elements are deliberately overstretched and then snap back again into the initial position as a result of their spring action, engaging in the cutouts in the ceramic substrate. At the same time, by means of a frictional fit in the plane parallel to the component fitting surface, the covering device is fixed and, by a form fit in the direction perpendicular thereto, the Z direction, the covering device is prevented from becoming detached from the ceramic substrate as it is put onto a printed circuit board or during subsequent further processing to form an end product. Because of the snap-in elements, mechanical reworking of the covering device is no longer required, so that the reject rate is reduced considerably, since damage both to the ceramic substrate and to the covering device is avoided. Furthermore, the handling and process sequence are significantly simplified.

In accordance with an added feature of the invention, the covering device is provided for box-shaped ceramic modules in HF technology and is itself of box-like design, the spacers used being angle pieces supported in the corner regions of the surface of the ceramic substrate fitted with components, while side edge areas of the box-like covering device are spaced apart from the surface fitted with components.

For the purpose of engaging with a form fit in the cutout in the ceramic substrate, at least one snap-in element has a form-fitting element for the fixing in the Z direction, the Z direction extending vertically with respect to the surface of the ceramic substrate fitted with components. The form-fitting element of a snap-in element substantially comprises an angled portion or a projection of the snap-in element in the direction of lateral cutouts in the ceramic substrate.

In addition to the form-fitting element, a snap-in element has at least one frictional-fitting part, which fixes the covering device in the X-Y plane, which extends parallel to the surface of the ceramic substrate fitted with components. A frictional-fitting part of this type in one embodiment comprises a snap-in element arranged on opposite sides, the frictional-fitting part itself comprising two springs which press the snap-in element onto the ceramic substrate. When four snap-in elements are provided, engaging with four sides of the ceramic substrate, such a frictional fit in the X-Y plane is implemented with further increased security.

In one embodiment, a snap-in element has a lug which is preshaped in an L-shape and whose longitudinal limb extends laterally along the ceramic substrate and whose transverse limb engages in the lateral cutout in the ceramic substrate. Such a lug-like design of the snap-in elements has the advantage that the snap-in elements and the covering plate of the covering device can be formed from the same material, specifically advantageously a sheet-metal strip. A sheet-metal strip of this type can be produced from spring bronze, from sheet iron, which shields electromagnetic waves, or from aluminum sheet. The L-shaped lug can already be designed as a leaf spring on its longitudinal limb.

In a further embodiment of the invention, the snap-in element is arranged with its upper end on the upper covering plate of the covering device. This arrangement makes it possible for snap-in elements arranged in pairs to be spread apart from each other with the aid of a spreading tool and to snap back into their initial form as soon as the lateral cutout on the ceramic module has been reached, wherein cutout the snap-in elements engage.

In a further embodiment of the invention, the snap-in element is arranged with its upper end in the center of a torsion beam, which is molded into the upper covering plate. In this embodiment, the snap-in element may be stiff in its longitudinal extent, since the torsion beam molded into the upper covering plate performs the spring action. In order to shape a torsion beam out of the upper covering plate, a U-shaped cutout is formed in the covering plate, its side limbs defining the length of the torsion beam and its transverse limb defining a first longitudinal side of the torsion beam. The snap-in element is arranged with its upper region on a second longitudinal side of the torsion beam, located opposite the first longitudinal side. When the snap-in element is spread with the aid of a spreading tool, at the same time the torsion beam molded into the covering plate is rotated and springs back into its initial position as soon as the formfitting element of the snap-in element has reached the cutout in the ceramic substrate, and therefore the snap-in element engages in the cutout after the spreading tool has been removed.

In a further embodiment of the invention, the ceramic substrate has transverse grooves in its edge areas. By using the transverse grooves, the individual layers of a multilayer ceramic substrate can be connected to one another by means of external metallization of the transverse grooves. However, the transverse grooves can also be used to solder dowel pins or contact pins to the ceramic module.

In a further embodiment of the invention, the ceramic substrate has a plurality of ceramic layers, conductor track layers and layers with thin-layer components such as resistors and capacitors, it being possible for the conductor tracks of the conductor track layers of the multilayer ceramic substrate to be connected electrically via plated-through contacts or via contacts in the transverse grooves. By means of such an embodiment of the high-frequency of the ceramic module, extremely complex circuits can be constructed in a very compact way, can be shielded by the covering device and protected mechanically.

In a further embodiment of the invention, the snap-in element can have a solder tab for soldering the covering device with ceramic substrate onto a printed circuit board. Such a solder tab combined with the snap-in elements at the same time achieves the situation where displacement of the ceramic substrate on the printed circuit board or loss of the covering device on the printed circuit board is ruled out.

In a further embodiment of the invention, side edge areas of the covering device are penetrated by openings and divided into a plurality of side edge sections. These side edge sections are for their part spaced apart from the surface of the ceramic substrate that carries components, while angle pieces in the corners of the ceramic substrate are supported on the corners of the ceramic substrate, determining the spacing as spacers. With the aid of dividing the side edge areas into a plurality of individual, separate side edge sections independent of one another, detrimental effects of different expansion coefficients of the ceramic substrate and of the covering device, such as thermal stresses, are avoided, particularly since the side edge sections are spaced apart from the ceramic substrate.

In a further preferred embodiment of the invention, a side edge section adjacent to the snap-in element has a projection which is supported on the surface of the ceramic substrate fitted with components. With this projection, the situation is advantageously achieved where an abutment is formed against the bending forces of the snap-in elements which otherwise act on the ceramic substrate. Without this projection of a side edge section, supported on the ceramic substrate as an abutment, a bending load would be exerted on the ceramic substrate with respect to the corner angles of the covering device by the snap-in elements, which are engaged approximately centrally with the ceramic substrate, in the cutouts. The bending load acts as a tensile stress, in particular in the upper ceramic layers, and could lead to microcracks in the ceramic substrate. In order to prevent this risk, the projection of the side edge section, which is adjacent to the snap-in element, forms an appropriate abutment by being supported on the surface of the ceramic substrate fitted with components.

The covering device is used for ceramic modules and protects the latter against damage and shields the surface fitted with components against interference fields.

With the above and other objects in view there is also provided, in accordance with the invention, a method of producing a covering device which has the following method steps:

providing a metal sheet;
stamping out a preform from the metal sheet with a structure which has the features of the covering device in the plane of the metal sheet; and
angling the side edge areas, the angle pieces and the snap-in elements into their three-dimensional form.

Using this method, a covering device is produced with simple means and the device can have the features of the different embodiments of the covering device according to the invention. The step of stamping out and angling to form a three-dimensional box-like covering device can be furnished by a stamping tool in a corresponding stamping press in a stamping and pressing operation, so that the last two steps of the above production method can be carried out in combination. A covering device produced simply in this way can be introduced into an automatic mounting device as bulk goods and can be fed via such an automatic mounting device to the ceramic substrates to be covered.

In a method of covering a ceramic module with a covering device, in further method steps, a ceramic substrate having a cutout on two opposite sides of the ceramic substrate in each case for anchoring the snap-in elements is provided and, finally, by placing the covering device onto the surface of the ceramic substrate fitted with components, whilst spreading the snap-in elements by means of a spreading tool and guiding the snap-in elements along the sides of the ceramic substrate until the snap-in elements latch into the cutouts in the ceramic substrate, the final assembly of a covering device with HF ceramic modules is performed.

Covering the ceramic modules is therefore possible without mechanical reworking. In particular, the embodiment of the snap-in connection achieves reliable retention of the covering device on the ceramic substrate by means of a frictional and form fit. With the aid of the torsion spring, which is molded into the upper covering plate, no overexpansion of the covering material occurs during the mounting, nor any plastic deformation of the covering material. Furthermore, with the covering device according to the invention, sorting of the ceramic substrates by tolerance classes is dispensed with, since the covering device can be adapted to all the tolerance classes of a ceramic material by means of the snap-in elements.

In a method of fitting a ceramic module with covering device to a printed circuit board, solder tabs of the covering device are fitted into prepared positions on a printed circuit board, and the solder tabs can be soldered to the printed circuit board in order to fix the covering device with the ceramic substrate onto the printed circuit board. This achieves a secure soldered connection on the printed circuit board by means of the corresponding solder tabs of the covering device.

In the case of HF ceramic modules which need shielding and mechanical protection, the covering device according to the invention can be used with success. The ceramic substrate in this case, as a carrier, is fitted with SMD housings or chips and wired appropriately. The covering device is then put on and secured against falling off. This securing must both have mechanical strength and be capable of being soldered to a printed circuit board. This requirement is also met by the covering device according to the invention.

Other features which are considered as characteristic for the invention are set forth in the appended claims.

Although the invention is illustrated and described herein as embodied in a covering device for ceramic modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a plan view of a further part of the covering device of FIG. 1 on the side of the covering device, with ceramic substrate but without a snap-in element;

FIG. 4 is a sectional view of the embodiment of the invention taken along the section line IV—IV in FIG. 2;

FIG. 7 is a plan view of a further part of the covering device of FIG. 5 on the side of the covering device, without a snap-in element; and FIG. 8 is a sectional view of an embodiment of the covering device taken along the section line VIII—VIII of FIG. 6.

DESCRIPTION OF THE PREFERRED EMBODIMENTS

Figure 1:
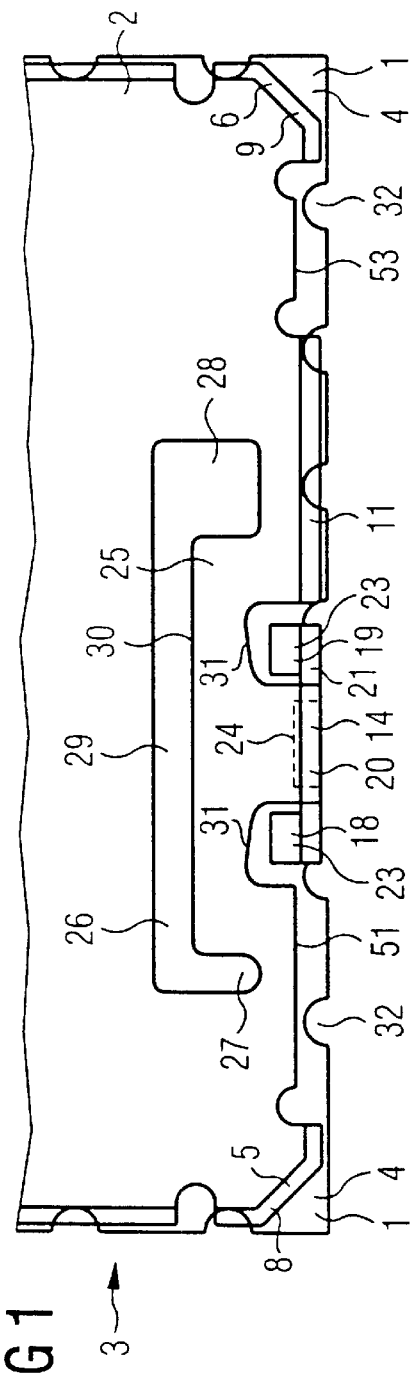
FIG. 1 is a plan view of part of a covering device having a snap-in element according to one embodiment of the invention.

Referring now to the figures of the drawing in detail and first, particularly, to FIG. 1 thereof, there is seen a plan view of part of a covering device 3 having a snap-in element 14 corresponding to one embodiment of the invention. In this embodiment, the snap-in element 14 is suspended with its upper end 24 in the center of a torsion beam 25, the torsion beam 25 being molded into the upper covering plate 2 of the covering device 3. In order to mold the torsion beam 25 into the covering plate 2, a U-shaped cutout 26 is provided in the covering plate 2. The side limbs 27 and 28 of the U-shaped cutout 26 limit the length of the torsion beam 25, while the transverse limb 29 of the U-shaped cutout 26 defines a first longitudinal side 30 of the torsion beam. On the opposite longitudinal side 31 of the torsion beam, the snap-in element 14 with its upper end 24 is machined in centrally.

In the plan view of FIG. 1 of an embodiment of the covering device, the ceramic substrate 1 of the ceramic module can be seen, being fitted substantially underneath the covering device. The distance between the covering plate 2 of the covering device 3 and the ceramic substrate 1 of the ceramic module is defined by angle pieces 5 and 6, as spacers, so that, between the covering plate 2 and the surface of the ceramic substrate 1, high-frequency components or high-frequency chips belonging to the ceramic module can be arranged, shielded by the covering device 3 and protected mechanically. The covering device 3 is fixed to the ceramic substrate 1 with the aid of the snap-in element 14. For this purpose, the snap-in element 14 has an L-shaped lug 21, whose transverse limbs 23 engage in a corresponding cutout in the ceramic substrate 1 and therefore fix the covering device on the ceramic substrate 1 with a form fit in the Z direction, which extends perpendicular to the surface 4 fitted with components.

The fixing of the covering device 3 in the plane of the drawing in the X and Y directions is substantially effected by the frictional connection with which the angle pieces are pressed, with the aid of the snap-in element 14, against the surface 4 of the ceramic substrate fitted with components. This frictional action is substantially achieved by rotating the torsion beam 25 as the snap-in element 14 engages in the lateral cutout in the ceramic substrate. In addition, the frictional-fitting element, which comprises a pair of opposite snap-in elements, contributes to the fixing of the covering device in the X-Y direction.

Figure 2:
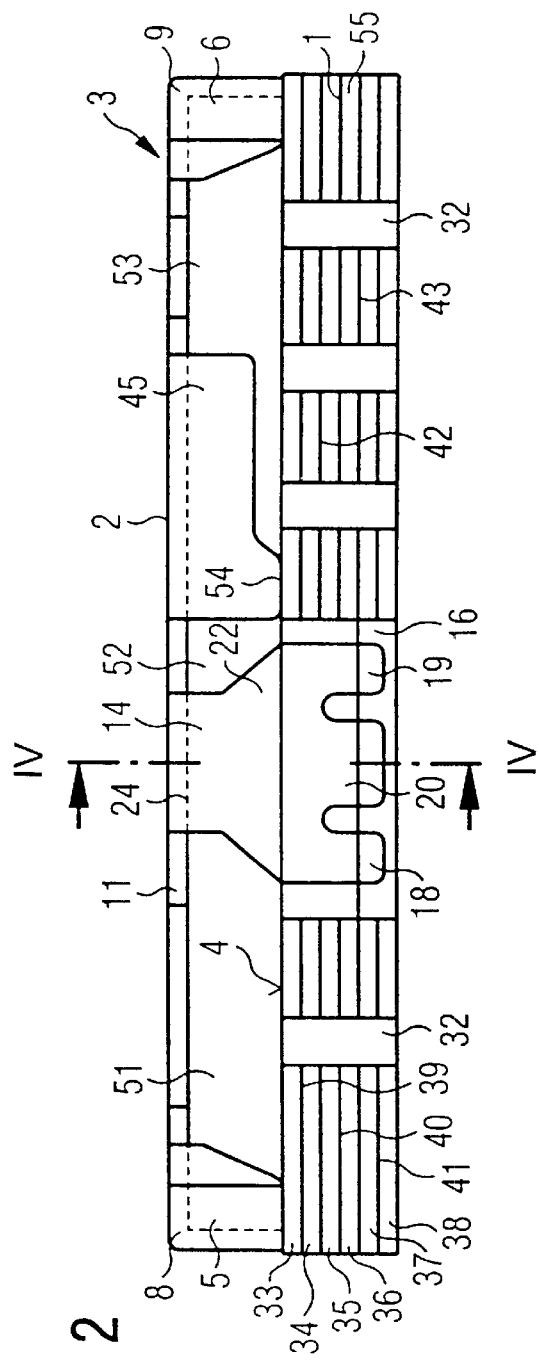
FIG. 2 is a side view of the embodiment of FIG. 1 with a covering device and a ceramic module.

FIG. 2 shows a side view of the embodiment of the invention of FIG. 1 with a covering device 3 and a ceramic substrate 1. In this embodiment, the ceramic substrate 1 is a high-frequency ceramic module, which carries high-frequency components and chips between an upper covering plate 2 of the covering device 3 and the surface 4 of the ceramic substrate 1 fitted with components. In order to simplify the drawing, the components and chips on the surface 4 fitted with components have been left out of FIGS. 1–8.

The ceramic substrate 1 is built up from ceramic layers 33–38, between which conductor track layers 39–41 and layers with thin-layer elements 42 and 43 are inlaid. The conductor track layers can be connected by metalizing the transverse grooves 42, which are introduced in the edge area of the multilayer ceramic substrate 1. In addition, the transverse grooves 42 can accommodate contact pins or dowel pins, which are connected to a non-illustrated printed circuit board.

A cutout 16 is machined into the side edge area 55 of the ceramic substrate 1. The cutout 16 accommodates the transverse limb 23 (see FIG. 1) of the snap-in element and, on the other hand, offers space for the longitudinal limb of the snap-in element. In addition to the angle pieces 5 and 6 belonging to the covering device 3 and used as spacers, the side edge area of the covering device is substantially wherein by the openings 51 and 53, only a side edge portion 45 of the side wall having remained. This side portion 45 is substantially spaced apart from the surface 4 of the ceramic substrate 1 fitted with components and, adjacent to the snap-in element 14, has a projection 54 which is supported on the surface 4 of the ceramic substrate 1 fitted with components. The projection 54 of the side edge portion 45 therefore forms an abutment for the snap-in element that is engaged.

This therefore prevents the snap-in element 14 loading the ceramic substrate 1 in flexure. The corners of the covering device 8 and 9 are rounded slightly toward the covering plate 2, so that no sharp edges occur. The same rounding radius is also provided for the upper part 24 of the snap-in element 14, and also for the upper part of the side edge portion 45 in conjunction with the upper covering plate 2 of the covering device 3.

FIG. 3 shows a plan view of a further part of the covering device of FIG. 1 on the side of the covering device, with ceramic substrate 1 but without a snap-in element. The ceramic substrate 1 accommodates the angle pieces 6 and 7 of the covering device 3 in the corner areas 9 and 10 on the surface 4 fitted with components. From the upper covering plate 2, at the sides two side edge portions 46 and 47 are angled downward and have relatively large openings 48, 49 and 50, the side edge portions 46 and 47 being spaced apart from the surface 4 of the ceramic substrate 1 fitted with components, so that in the event of thermal loading, the side edge area 13 does not have any direct contact with the surface 4 of the ceramic substrate 1 fitted with components.

In addition, the openings 48, 49 and 50 make it easier for the upper covering plate 2 to bend in the event of thermal expansion differences between the covering device 3 and the ceramic substrate 1.

FIG. 4 shows a sectional view of the embodiment of the covering device 3 along a section line A—A in FIG. 2. In this sectional view, it is possible to see the ceramic layers 33–38 of the ceramic substrate 1, between which conductor track layers 39–41 and thin-layer component layers 42 and 43 are arranged. In this embodiment, the snap-in elements 14 and 15 are designed in an L-shape as lugs whose longitudinal limbs 22 clamp around the ceramic substrate 1 in pairs and thus have the effect of a frictional fit between the angle pieces 6 and 7 at the corners of the ceramic substrate, by which means the covering device 3 is fixed with a frictional fit in the X-Y plane, which lies parallel to the surface of the ceramic substrate 1 fitted with components.

The transverse limbs 23 of the L-shaped lug engage laterally in the cutouts 16 and 18 in the ceramic substrate 1 and fix the covering device 3 on the ceramic substrate 1 with a form fit.

Figure 5:
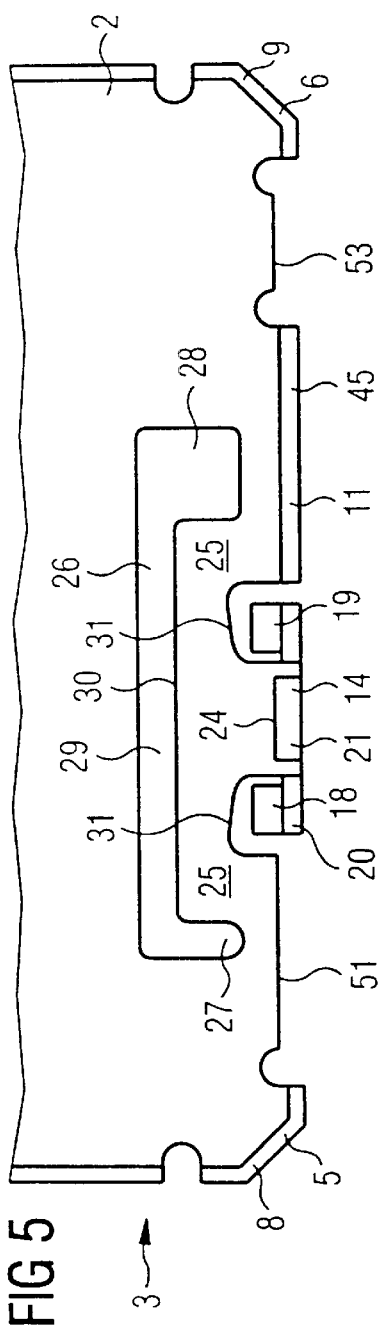
FIG. 5 is a plan view of part of an embodiment of the covering device, without ceramic substrate but with a snap-in element.

FIG. 5 shows a plan view of part of an embodiment of the covering device of the present invention, with a snap-in element 14 but without a ceramic substrate. This covering device, whose plan view can be seen in FIG. 5, can be produced from a metal sheet. In this embodiment, it has a snap-in element 14 which, for its part, has an L-shaped lug 21. The snap-in element 14 is arranged centrally with its upper end 24 on a torsion beam 25, which is machined into the upper covering plate 2 of the covering device 3. The torsion beam 25 is bounded by a U-shaped cutout 26 in the upper covering plate 2. This U-shaped cutout defines the length of the torsion beam and a first longitudinal side 30 of the torsion beam. On the opposite longitudinal side 31 of the torsion beam, the snap-in element 14 is arranged with its upper part central. The side edge area 11 of the covering device 3 is substantially formed by part of the snap-in element 14 and a side edge portion 45, while the rest has the openings 51, 52 and 53. With these openings, the upper covering plate 2 becomes easier to bend, in order, firstly, to fit it in a sprung manner with respect to the ceramic substrate and spaced apart by the angle pieces 5 and 6 and, secondly, to compensate for differences in the thermal expansion between the covering device and the ceramic substrate.

Figure 6:
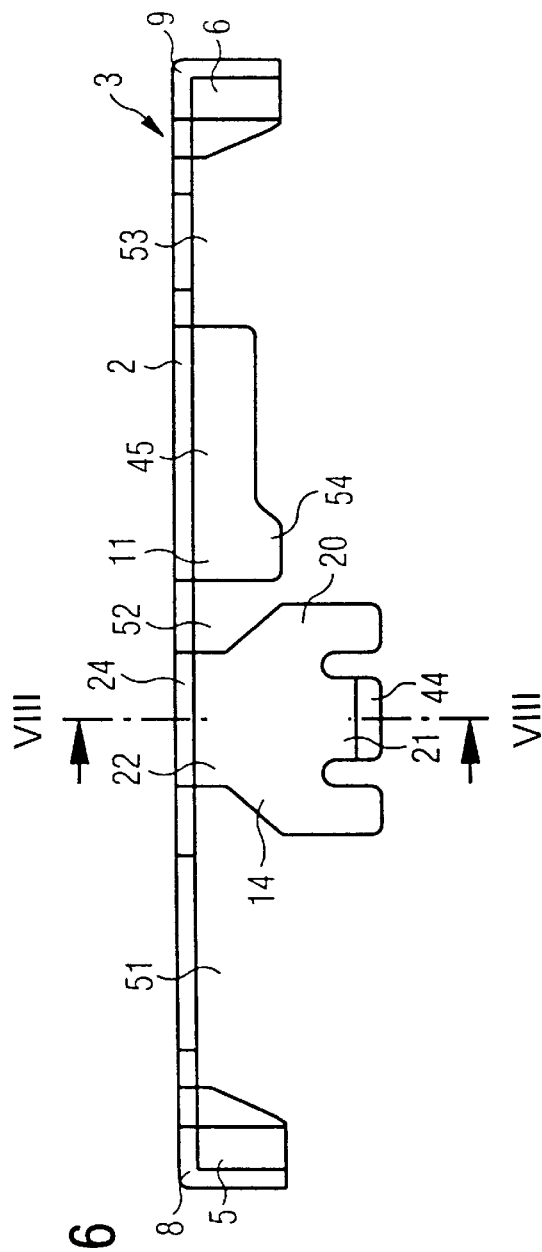
FIG. 6 is a side view of the embodiment of the covering device which can be seen in FIG. 5.

FIG. 6 shows a side view of the embodiment of the covering device which can be seen in FIG. 5. By leaving out the ceramic substrate, the significant parts of the covering device 3 are emphasized in FIG. 6. These significant parts are the upper covering plate 2, the side edge portion 45 with the projection 54 adjacent to the snap-in element 14. This snap-in element 14, as compared with the illustration in FIG. 2, additionally has a solder tab 44, which can be fitted in a position on a printed circuit board and there can be connected to the printed circuit board by a soldered connection. The projection 54 of the side edge portion 45, which is arranged adjacent to the snap-in element, forms an abutment with the ceramic substrate surface and partially absorbs the bending forces which the snap element, without this projection, would exert on the ceramic substrate. In order to leave the upper covering plate 2 flexible, no further side edge portions are angled away from the plate, instead openings 51, 52 and 53 are provided in the side edge area 11.

FIG. 7 shows a plan view of a further part of the covering device 3 of FIG. 5 on the side of the covering device 3, without a snap-in element 14 or 15. In the embodiment according to FIG. 7, with the side edge portions 46 and 47 on the side edge area 13, only part of the upper covering plate 2 is angled, so that on the side edge area, essentially the openings 48, 49 and 50 are produced, and permit the upper covering plate 2 to bend. Only in the corner areas 9 and 10 are angle pieces 6 and 7 provided, and are able to be supported on the surface 4 of the ceramic substrate fitted with components when the covering device 3 is assembled.

FIG. 8 shows a sectional view of an embodiment of the covering device 3 along the section line B—B of FIG. 6. The section line B—B in FIG. 6 is placed in such a way that it goes through the snap-in elements 14 and 15 arranged in pairs. In their lower area, the snap-in elements 14 and 15 have formfitting elements 18 and 19, which are able to engage with a form fit in cutouts corresponding to the snap-in elements of a ceramic substrate. The side edge area 13 has only side edge portions 46 and 47 which, for their part, form a spacing from the ceramic substrate when assembled, since the angle pieces 6 and 7 forming the spacing are designed to be longer in the Z direction as compared with the side edge portions 46 and 47. By spreading the snap-in elements 14 and 15 with the aid of a spreading tool, the form-fitting elements 18 and 19 can be led laterally past a ceramic substrate and snapped back into their initial position as soon as the form-fitting elements 18 and 19 have reached corresponding cutouts in the ceramic substrate. The ability of the snap-in elements to be spread covers all the tolerance classes of a ceramic substrate, so that only one design of the covering device according to the invention is necessary in order to permit employment for all the tolerance classes of a ceramic substrate.

We claim:

1. A covering device for a ceramic module of the type having electronic components arranged on a surface of a ceramic substrate, the covering device comprising:

an upper covering plate to be disposed above the electronic components on the surface of the ceramic substrate;

spacers supporting the covering device on the surface of the ceramic substrate fitted with the electronic components;

linear elongated snap-in elements on at least two opposite side edge areas of the covering device, said elongated snap-in elements spreading outwards from an initial position and snapping back into said initial position when the covering device is placed on the ceramic module, said elongated snap-in elements engaging with at least one of a frictional fit and a form fit in lateral elongated cutouts formed in side edge areas of the ceramic substrate and corresponding to said elongated snap-in elements.

2. The covering device according to claim 1, wherein at least one of said snap-in elements has at least one form-fitting element fixing the covering device in a Z direction extending vertically with respect to the surface of the ceramic substrate fitted with the electronic components.

3. The covering device according to claim 1, wherein at least one of said snap-in elements has at least one frictional-fitting part, for fixing the covering device in an X-Y plane extending parallel to the surface of the ceramic substrate fitted with the electronic components.

4. The covering device according to claim 1, wherein at least one of said snap-in elements has an L-shaped lug with a longitudinal limb extending laterally along the ceramic substrate and a transverse limb engaging in the lateral cutout in the ceramic substrate.

5. The covering device according to claim 1, wherein said snap-in element is arranged with an upper end thereof on said upper covering plate.

6. The covering device according to claim 1, which further comprises a torsion beam molded into said upper covering plate, and wherein saud snap-in element is arranged with its upper end in a center of said torsion beam.

7. The covering device according to claim 6, wherein said torsion beam is formed by a U-shaped cutout having side limbs defining a length of the torsion beam and transverse limb defining a first longitudinal side of said torsion beam, and wherein said snap-in element is arranged on a second longitudinal side of said torsion beam, located opposite said first longitudinal side.

8. The covering device according to claim 1, wherein the covering device is box-shaped and said spacers are angle pieces supported on corners of the ceramic substrate.

9. The covering device according to claim 1, wherein the ceramic substrate is formed with transverse grooves in edge areas thereof.

10. The covering device according to claim 1, wherein the ceramic substrate is built up in a number of layers from ceramic layers, conductor track layers and layers with thin-layer components including resistors and capacitors, the conductor tracks of the conductor track layers of the multilayer ceramic substrate being connected electrically via plated-through contacts.

11. The covering device according to claim 1, wherein said snap-in elements have a solder tab for soldering the covering device with the ceramic substrate to a printed circuit board.

12. The covering device according to claim 1, wherein side edge areas of the covering device have penetrating openings formed therein and are divided up into side edge portions.

13. The covering device according to claim 12, wherein said side edge portions are spaced apart from the surface of the ceramic substrate fitted with the electronic components.

14. The covering device according to claim 1, wherein a side edge portion adjacent said snap-in element is formed with a projection supported on the surface of the ceramic substrate fitted with the electronic components.

15. In combination with a ceramic module of the type having electronic components arranged on a surface of a ceramic substrate, a covering device comprising:

an upper covering plate to be disposed above the electronic components on the surface of the ceramic substrate;

spacers supporting the covering device on the surface of the ceramic substrate fitted with the electronic components;

linear elongated snap-in elements on at least two opposite side edge areas of the covering device, said elongated snap-in elements spreading outwards from an initial position and snapping back into said initial position when the covering device is placed on the ceramic module, said elongated snap-in elements engaging with at least one of a frictional fit and a form fit in lateral elongated cutouts formed in side edge areas of the ceramic substrate and corresponding to said elongated snap-in elements.

16. A method of producing a covering device, and covering a ceramic module which comprises the following method steps:

providing a metal sheet;

stamping a preform out of the metal sheet with a structure having an upper covering plate, spacers and linear elongated snap-in elements in a plane of the metal sheet;

angling side edge areas of the spacers and of the elongated snap-in elements into a three-dimensional form;

spreading the elongated snap-in elements outwards from an initial position and snapping back into said initial position when the covering device is placed on the ceramic module; engaging said elongated snap-in element with at least one of a frictional fit and a form fit in lateral elongated cutouts formed in side edge areas of the ceramic substrate.

17. A method of covering a ceramic module, which comprises the following method steps:

providing a ceramic substrate having a surface fitted with components and formed with an elongated cutout on each of two opposite sides for anchoring linear elongated snap-in elements;

placing a covering device onto the surface fitted with components while spreading the elongated snap-in elements of the covering device with a spreading tool and guiding the elongated snap-in elements along the sides of the ceramic substrate until the elongated snap-in elements latch into the elongated cutouts in the ceramic substrate.

18. A method of levering a ceramic module with a covering device, which comprises the following method steps:

providing a ceramic module having a surface with electronic components and formed with an elongated cutout on each of two opposite sides of the ceramic module; a covering device with an upper covering plate having linear elongated snap-in elements on at least two opposite side edge areas of the covering device;

spreading the elongated snap-in elements outwards from an initial position and snapping back into said initial position when the covering device is placed on the ceramic module; engaging said elongated snap-in element with at least one of a frictional fit and a form fit in lateral elongated cutouts formed in side edge areas of the ceramic substate.

19. A covered ceramic module assembly, comprising:

a ceramic module formed with a ceramic substrate having a surface fitted with electronic components and formed with lateral elongated cutouts in a side edge areas thereof;

a covering device having an upper covering plate disposed above the electronic components and spacers supporting said covering device on the surface of said ceramic substrate fitted with the electronic components, said covering device having linear elongated snap-in elements on at least two opposite side edge areas of the covering device, said elongated snap-in elements spreading outwards from an initial position and snapping back into said initial position when the covering device is placed on the ceramic module; said elongated snap-in elements engaging with at least one of a frictional fit and a form fit in said lateral elongated cutouts formed in side edge areas of the ceramic substrate.

20. The assembly according to claim 19, wherein said ceramic substrate is formed with transverse grooves in edge areas thereof.

21. The assembly according to claim 19, wherein said ceramic substrate is a multilayer substrate built up in a number of layers from ceramic layers, conductor track layers and layers with thin-layer components selected from the group consisting of resistors and capacitors, and said conductor tracks of the conductor track layers of said multilayer ceramic substrate are connected electrically via plated-through contacts.

* * * * *